United States Patent
Powell et al.

[11] Patent Number: 6,111,450
[45] Date of Patent: Aug. 29, 2000

[54] OPERATING VOLTAGE ADAPTING BUFFER

[75] Inventors: Gary Paul Powell, Allentow; Ho Trong Nguyen, Allentown; Richard G. Stuby, Jr., New Tripoli, all of Pa.

[73] Assignee: Lucent Technologies, Inc., Murray Hill, N.J.

[21] Appl. No.: 09/115,693

[22] Filed: Jul. 15, 1998

[51] Int. Cl.⁷ ...................................................... H03L 5/00
[52] U.S. Cl. ........................ 327/333; 327/312; 327/313; 327/319; 327/321
[58] Field of Search ..................................... 327/310, 312, 327/313, 314, 318–321, 331, 332, 333, 534, 535

[56] References Cited

U.S. PATENT DOCUMENTS

| | | | |
|---|---|---|---|
| 5,510,749 | 4/1996 | Arimoto | 327/332 |
| 5,677,642 | 10/1997 | Rehm et al. | 327/321 |
| 5,914,626 | 6/1999 | Kim et al. | 327/321 |
| 5,929,686 | 7/1999 | Itou | 327/321 |

OTHER PUBLICATIONS

PCI Local Bus Specification; Revision 2.1; Jun. 1, 1995.
PCI Local Bus; PCI to PCI Bridge Architecture Specification; Revision 1.0; Apr. 5, 1994.

*Primary Examiner*—Kenneth B. Wells
*Attorney, Agent, or Firm*—Dickstein Shapiro Morin & Oshinsky LLP

[57] ABSTRACT

The present invention provides an integrated circuit having an operating voltage adaptable buffer, capable of operating in different voltage signaling environments, which includes a control circuit that provides a clamping function to the signaling path under prescribed operating conditions and which also reliably biases the p-type transistor substrate voltage of the buffer to the most positive voltage seen by the buffer under all operating conditions occurring on the signaling path, thereby protecting the p-type transistors.

53 Claims, 5 Drawing Sheets

OPERATING VOLTAGE ADAPTING BUFFER

FIELD OF THE INVENTION

The current invention relates to buffers and more particularly to a buffer capable of operating in plural voltage level signaling environments.

BACKGROUND OF THE INVENTION

The use of local buses has become increasingly popular in the personal computer industry. Local buses are buses used to connect the system's processor to high bandwidth I/O peripherals such as displays, disk drives, etc. One such local bus in widespread use today is the PCI local bus. Because the PCI local bus has gained widespread acceptance, the buffer of the invention will be illustrated for use with this bus. The invention is not limited, however, to a buffer for this or any other particular bus or for use with the specific voltages discussed below.

The PCI Local Bus Specification, Rev. 2.1s, dated Jun. 1, 1995 (hereinafter referred to as the "PCI Spec"), defines two signaling environments, a 5 volt signaling environment and a 3.3 volt signaling environment. 5 volt and 3.3 volt refer to the voltage of a logical "1" signal in the respective signaling environments. The PCI Spec dictates that the signal voltage be clamped to 3.3 volts in a 3.3 volt environment, but does not require this clamping function in a 5 volt environment. The PCI Spec also contemplates a "universal board" that is capable of detecting the signaling environment in use and adapting itself to that environment.

The PCI local bus signaling environments are not dependent upon the component technologies used. A "5 volt component" can be designed to work in a 3.3 volt environment; and a "3.3 volt component" can be designed to work in a 5 volt environment. Component technologies of both voltages may be present on a PCI local bus at the same time. The PCI Spec contemplates 5 volt tolerant 3.3 volt implementations of universal boards. A 5 volt tolerant, 3.3 volt universal board is one implemented with 3.3 volt components that can function in a 5 volt signaling environment or a mixed 5 and 3.3 volt signaling environment. "3 volt," and "3.3 volt" as used herein refer to a nominal 3.3 volt voltage level; "5 volt" refers to a nominal 5 volt voltage level. The term "bus" as used herein refers not only to a formal bus architecture, but to any signaling path between any two devices. The term "pad" as used herein refers to a terminal or other physical electrical connection to a bus or signaling path.

FIG. 1 illustrates a known 5 volt tolerant, 3.3 volt output buffer 14 for use in a universal board. The buffer 14 is connected to the bus at pad 10. The additional buffer circuitry 18 is the circuitry that handles driving the bus (sourcing and sinking current to assert logic 1's or 0's, respectively) with a signal received from a peripheral, receiving data from the bus to drive a peripheral, and isolating a peripheral from the bus. Implementations of additional buffer circuitry 18 are well known in the art and need not be further discussed here. The buffer 14 includes a substrate voltage control circuit 16 that sets the substrate voltage for the p-type transistors included in the additional buffer circuitry 18. Because the voltage seen at the pad 10 may be 5 volts, which is higher than VDD=3.3 volts in a 5 volt tolerant, 3.3 volt buffer, the control circuit 16 is necessary to ensure that the substrate of p-type transistors is set to the highest voltage present. Should the substrate of the p-type transistors not be connected to the highest voltage present, undesirable or unpredictable behavior of the buffer may result as the p-n junctions between the active areas and the substrate may become forward biased. The substrate of the p-type transistors is an N-type well, referred to herein as an N-well or N-well substrate.

FIG. 2 illustrates a known substrate voltage control circuit 16 for use in a 5 volt tolerant, 3 volt buffer. The control circuit 16 includes a first P-type transistor 22 and a second P-type transistor 24. The gate of the transistor 22 is connected through a resistor 28 to the pad 10. The gate of the transistor 24 is connected through a resistor 26 to the supply voltage (referred to herein as "VDD"), which is 3.3 volts, at node 20. Resistor 26, together with the transistors 22, 24, form an output stage 32 with the gate of the transistor 22 being controlled by the voltage at the pad 10. One side of the transistor 22 is also connected to VDD. The other side of the transistor 22 is connected to one side of the second output stage transistor 24. The remaining side of the second output stage transistor 24 is connected to the pad 10.

As used herein, a "side" of a transistor is a generic term that refers to either the source or the drain, i.e., the connections to the active areas of the transistor. The transistors discussed herein are MOSFETs, which are symmetrical such that the source and drain are reversible. Because the voltages seen by some transistors are such that a single side of a transistor may function as a source under some conditions and a drain under others, only the generic term "side" will be used herein.

Operation of the known control circuit 16 in the presence of different signaling environments will now be described. In a 5 volt signaling environment, when the pad 10 is driven to a logic 1, nominally 5 volts, the transistor 22 will turn off, but transistor 24 will turn on. Transistor 24 turns on even though the gate is connected to VDD=3.3 volts because the gate of the transistor becomes more than one VTP (where VTP refers to the threshold voltage of the p-type transistor) below the 5 volts on the side of the transistor that is connected to the pad 10. The result is that the N-well voltage node 30 will follow the pad 10 voltage when the pad 10 voltage exceeds VDD+VTP. The substrates of the transistors 22, 24 are also connected to the N-well voltage node 30 to protect these transistors from damage along with the p-type transistors that form part of the additional buffer circuitry 18.

When the pad 10 is driven to logic 0 (nominally 0 volts), the transistor 22 is turned on and the transistor 24 is off. The result is that the N-well voltage node 30 is at VDD=3.3 volts. This is acceptable even in a 5 volt environment because VDD=3.3 volts will be the highest voltage present when the pad 10 is at a low voltage corresponding to logic 0.

In the 3.3 volt signaling environment, the transistor 24 is normally off because the gate is connected to VDD and the pad 10 is normally below VDD+VTP. Therefore, when the pad 10 is driven low, the transistor 22 will turn on and the N-well voltage node 30 will be at VDD=3.3 volts. However, when the pad 10 is driven high, both transistors 22 and 24 turn off. The result is that first, the signal voltage at the pad 10 is no longer clamped by the connection through the transistor 22 to the supply voltage VDD=3.3 volts; and second, the N-well voltage node 30 is allowed to float. This is in contravention to the PCI spec, which dictates that the signal voltage be clamped to 3.3 volts in the 3.3 volt signaling environment.

What is needed is a configurable substrate voltage control circuit that will reliably bias the N-well substrate of p-type transistors to the more positive voltage of either the supply voltage or the data on the bus under all operating conditions on the bus while providing the appropriate clamping function.

SUMMARY OF THE INVENTION

The present invention provides an integrated circuit having an operating voltage adaptable buffer with a control circuit that reliably biases the p-type transistor substrate voltage to the most positive voltage seen by the buffer under all operating conditions occurring on the bus, while also providing the appropriate clamping function on the bus. When in a second (or lower) voltage signaling environment (e.g. 3.3 volts), the control circuit biases the substrates of the p-type transistors to the 3.3 volt supply voltage. When in a first (or higher) voltage signaling environment (e.g. 5 volts), the control circuit biases the N-well substrates of the p-type transistors to the pad voltage when the pad voltage exceeds the supply voltage (3.3 volts) plus a p-type transistor threshold voltage, and biases the substrates of the p-type transistors to the supply voltage otherwise. In this manner, the substrate voltage is always set to the highest voltage present, which protects the p-type transistors in the high voltage environment. Furthermore, the control circuit also establishes a path from the pad to the supply when in the lower signaling environment, thereby providing the appropriate clamping function on the bus.

These and other advantages, characteristics and features of the invention will be better understood from the following detailed description which is provided in connection with the accompanying drawings.

DETAILED DESCRIPTION OF THE EMBODIMENTS

Figure 3:
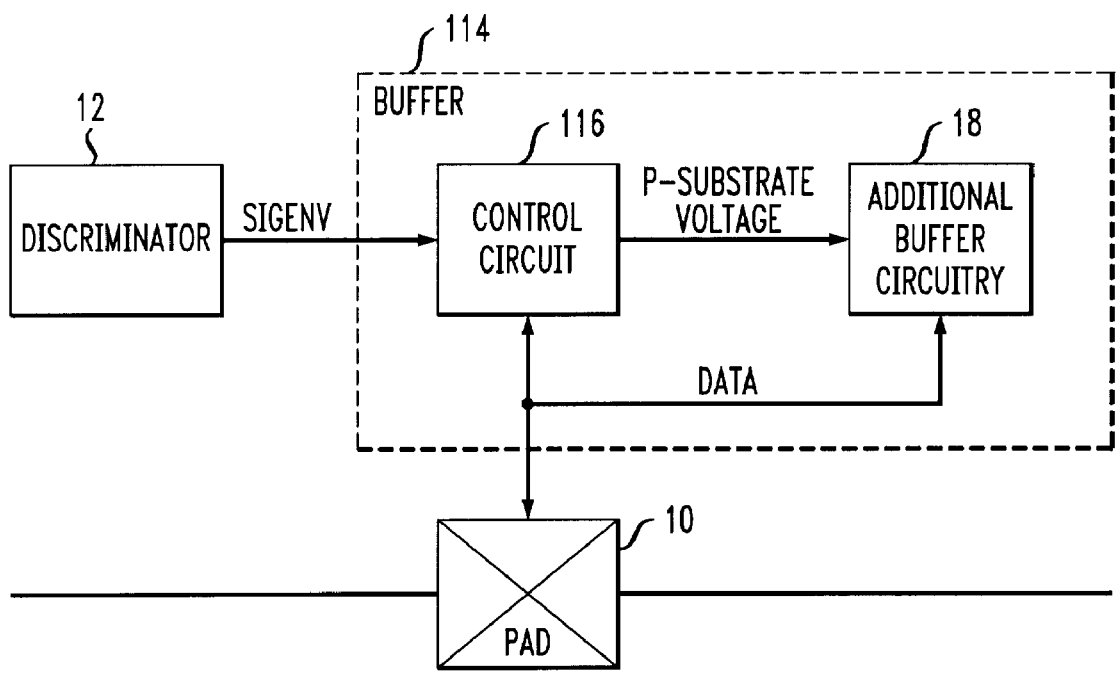
FIG. 3 is a block diagram of a configurable 5 volt tolerant, 3 volt buffer according to one embodiment of the present invention.

FIG. 3 illustrates a 5 volt tolerant, 3.3 volt buffer 114 according to one embodiment of the present invention. The buffer 114 can be included in an integrated circuit, but the invention is not limited to an integrated circuit embodiment. The buffer 114 includes a control circuit 116 that biases the N-well substrate of the p-type transistors used in control circuit 116 and the p-type transistors that form part of additional buffer circuitry 18. The control circuit 116 and additional buffer circuitry 18 are connected to receive data from and send data to pad 10.

Figure 7:
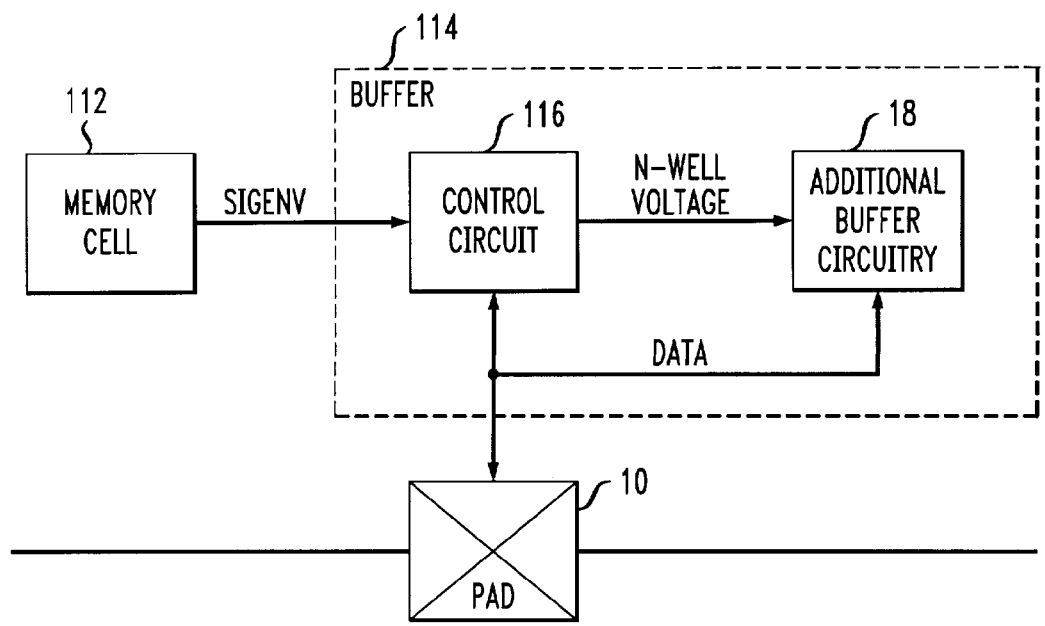
FIG. 7 is a block diagram of a configurable 5 volt tolerant, 3 volt buffer according to a third embodiment of the present invention.

The control circuit 116 is supplied with a binary signal, SIGENV, that indicates whether the buffer 114 is working in a 5 volt or 3.3 volt signaling environment. As illustrated in FIG. 3, the SIGENV signal is supplied by a voltage discriminator 12, which determines which voltage signaling environment is being used on a bus to which pad 10 is connected. An exemplary discriminator 12 that can be used with the invention is disclosed in a co-pending application entitled "I/O Power Supply Discriminator," Ser. No. 09/115, 683, filed on the same day as this application. The discriminator 12 will not be discussed further herein. It should be noted that the invention is not limited to use with a discriminator 12. The SIGENV signal may originate from a memory location, for example, when information about the signaling environment is known in advance. FIG. 7 illustrates a buffer 114 that is supplied with a SIGENV signal from a memory location 112. The SIGENV signal may be provided in numerous other ways, depending upon the application.

Figure 4:
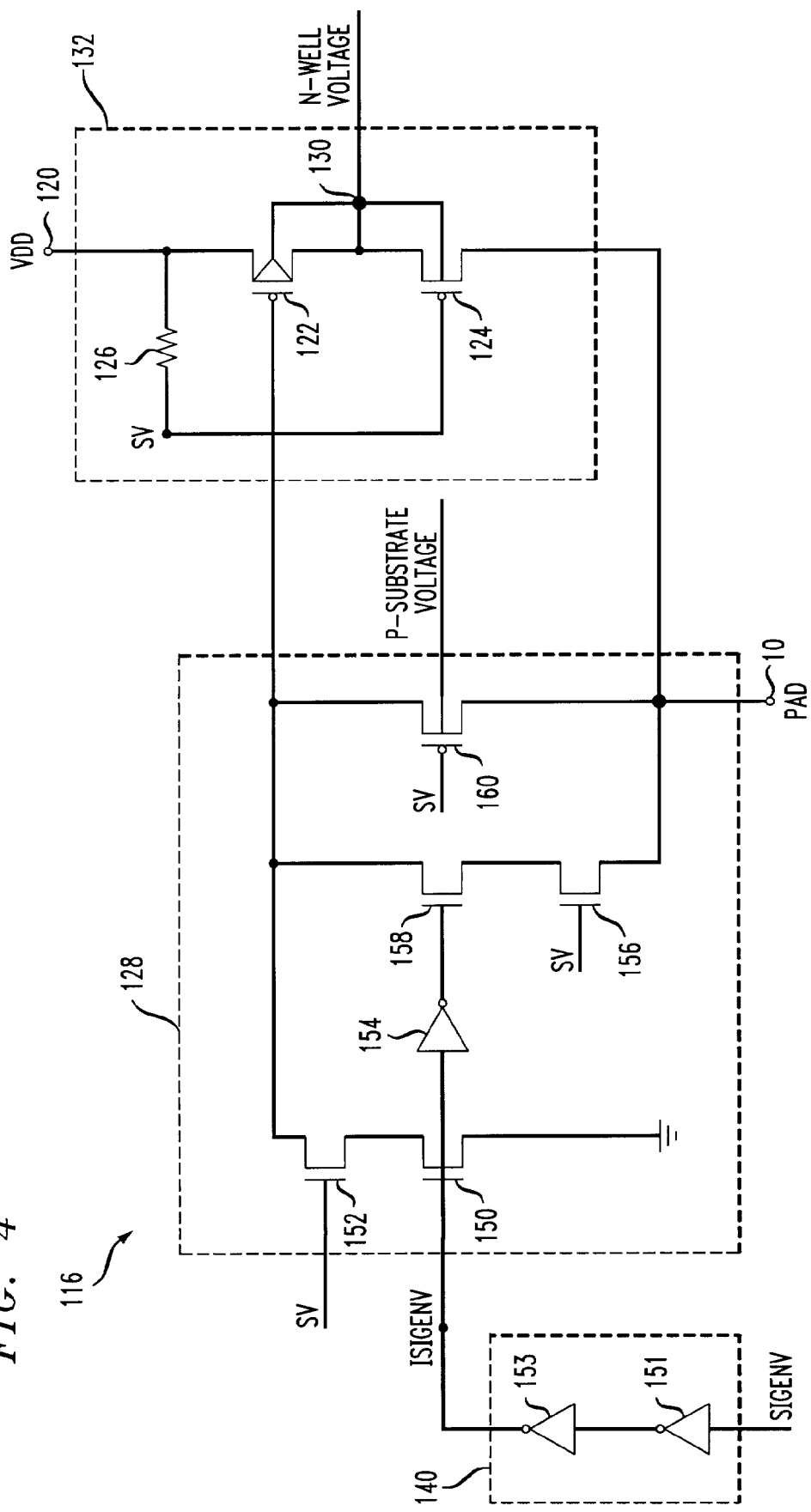
FIG. 4 is a circuit diagram of the substrate voltage control circuit of the buffer of FIG. 3 according to one embodiment of the present invention.

FIG. 4 illustrates a control circuit 116 according to one embodiment of the present invention. The control circuit 116 comprises an output stage 132, a gate control circuit 128, and an isolation circuit 140. The gate of transistor 122 of the output stage 132 is connected to the gate control circuit 128. The gate control circuit 128 sets the gate voltage of the transistor 122 depending upon the ISIGENV signal received from the isolation circuit 140. The isolation circuit 140 receives the SIGENV signal from the discriminator 12 and outputs the ISIGENV signal, which is a buffered version of the SIGENV signal.

Figure 1:
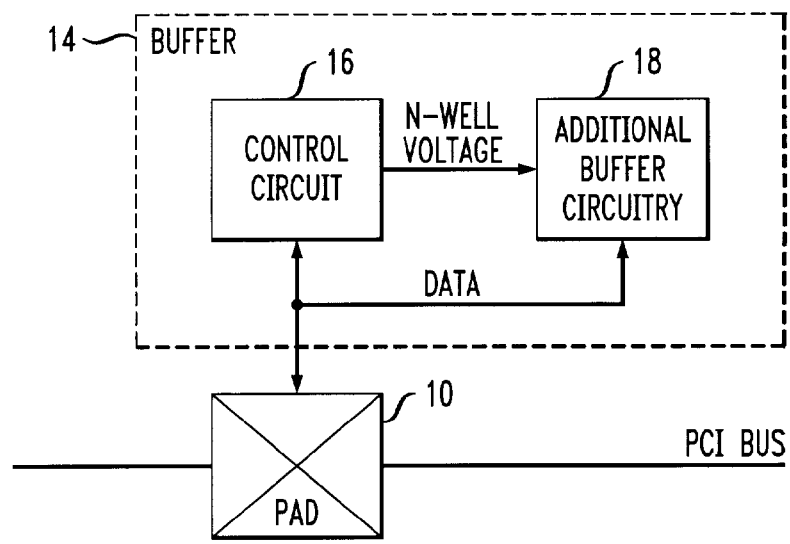
FIG. 1 is a block diagram of a known configurable 5 volt tolerant, 3 volt buffer.
Figure 2:
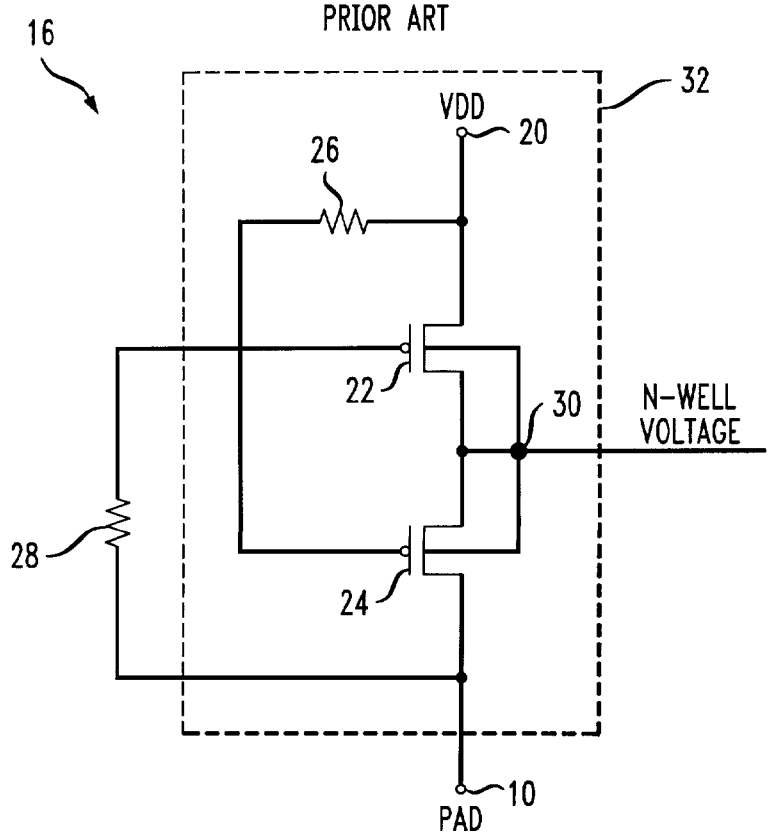
FIG. 2 is a circuit diagram of the substrate voltage control circuit of the buffer of FIG. 1.

The isolation circuit 140 is formed of two inverters 151, 153 connected in series which serve to isolate the SIGENV signal from the rest of the buffer 114. The output stage 132 is similar to the output stage 32 discussed in connection with FIG. 2, except for two things. First, the transistor 122 is a high threshold p-type transistor with a threshold voltage VTHP. The threshold voltage VTHP is greater than the threshold voltage VTP for the transistor 124, but is lower than VDD-VTN (VTN is the threshold voltage of the n-type transistors in the circuit). Second, the gate of the transistor 122 is connected to the gate control circuit 128, rather than to the pad 10 through a resistor 28 as in FIG. 2.

The gate control circuit 128 comprises a first 5 volt isolation transistor 152 connected on one side to the gate of the first output stage transistor 122 of the output stage 132, and to one side of a first pull down transistor 150 on the other side. The remaining side of the first pull down transistor 150 is grounded. The gate of the first isolation transistor 152 is connected to VDD=3.3 volts through a resistor 126. The gate of the first pull down transistor 150 is connected to the output of the isolation circuit 140 and is therefore also controlled by the ISIGENV signal output by the isolation circuit 140.

Also connected to the gate of the transistor 122 is one side of a second pull down transistor 158. The gate of the second pull down transistor 158 is connected to the output of an inverter 154 whose input is connected to the ISIGENV signal supplied by the isolation circuit 140. The remaining side of the second pull down transistor 158 is connected to one side of a second isolation transistor 156. The other side of the second isolation transistor 156 is connected to the pad 10. A third p-type transistor 160 is also present, with one side connected to the pad 10, the other side connected to the gate of the transistor 122 and the gate connected to VDD=3.3 volts through resistor 126.

Operation of the circuit of FIG. 4 will now be explained in detail. In a 3.3 volt signaling environment, the SIGENV and the ISIGENV signals will have a "1" logic state as SIGENV is received from the discriminator 12. The "1" logic level turns on the first pull down transistor 150. The first isolation transistor 152 is also turned on, so a path from the gate of the transistor 122 to ground is formed through the transistors 150, 152. (Transistors 158 and 160 will be off in this situation and therefore will not affect the gate of transistor 122.) Thus, regardless of the voltage at the pad 10, the first output stage transistor 122 is turned on. The second output stage transistor 124 is turned off under normal conditions because its gate is connected to VDD and the pad voltage does not exceed VDD in a 3.3 volt signaling environment under normal conditions. The result is that the N-well voltage node 130 is set to VDD=3.3 volts, thereby providing a substrate voltage output clamped to 3.3 volts. Should the pad 10 voltage exceed VDD+VTP (i.e., 3.3 v+VTP), transistor 124 turns on and the connection to VDD through the transistor 122 will clamp the pad 10 voltage to VDD.

In a 5 volt environment, the SIGENV and ISIGENV signals will be at a logic "0" level. This will cause transistor 150 to turn off, but the output of the inverter 154 will be set at 3.3 volts (logic 1). When the pad 10 voltage is at 0 volts, the transistor 160 is turned off and the second pull down transistor 158 is on since the gate is connected to the output of the inverter 154. The second isolation transistor 156 is also turned on, resulting in a path from the pad 10, through the two transistors 156, 158, to the gate of the transistor 122. This pulls down the gate of the transistor 122, causing it to turn on. Since transistor 124 is turned off, the output at the N-well voltage node 130 will, once again, be VDD=3.3 volts, just as in the known control circuit design.

When the pad 10 voltage is at 5 volts, the second output stage transistor 124 turns on when the pad 10 voltage is at VDD+VTP, so that the N-well voltage follows the pad voltage. When the pad voltage is at or is rising to the 5 volt level, it is necessary to ensure that there is no contention between the pad 10 voltage and VDD through the transistor 122, 124 path. Said another way, it is necessary to ensure that the transistor 122 is turned off before the transistor 124 is turned on when the pad voltage is rising to 5 volts. The presence of the additional p-type transistor 160 ensures that the voltage at the gate of the first output stage transistor 122 follows the pad 10 voltage when it exceeds VDD+VTP, while the use of a high threshold (relative to the threshold of the transistor 124) p-type transistor for the transistor 122 ensures that the transistor 122 will be turned off before the transistor 124 is turned on as the pad 10 voltage is rising to 5 volts. This prevents any current draw from the pad 10 by the supply from occurring during the 0 to 5 volt transition of the pad 10 voltage. (Under this condition, transistors 150 and 158 are off.) Without the additional p-type transistor 160, the gate voltage of the transistor 122 would be at pad voltage—VTN (through the 5 volt pull down transistor 158 and second isolation transistor 156 path), which would result in current draw.

Figure 5:
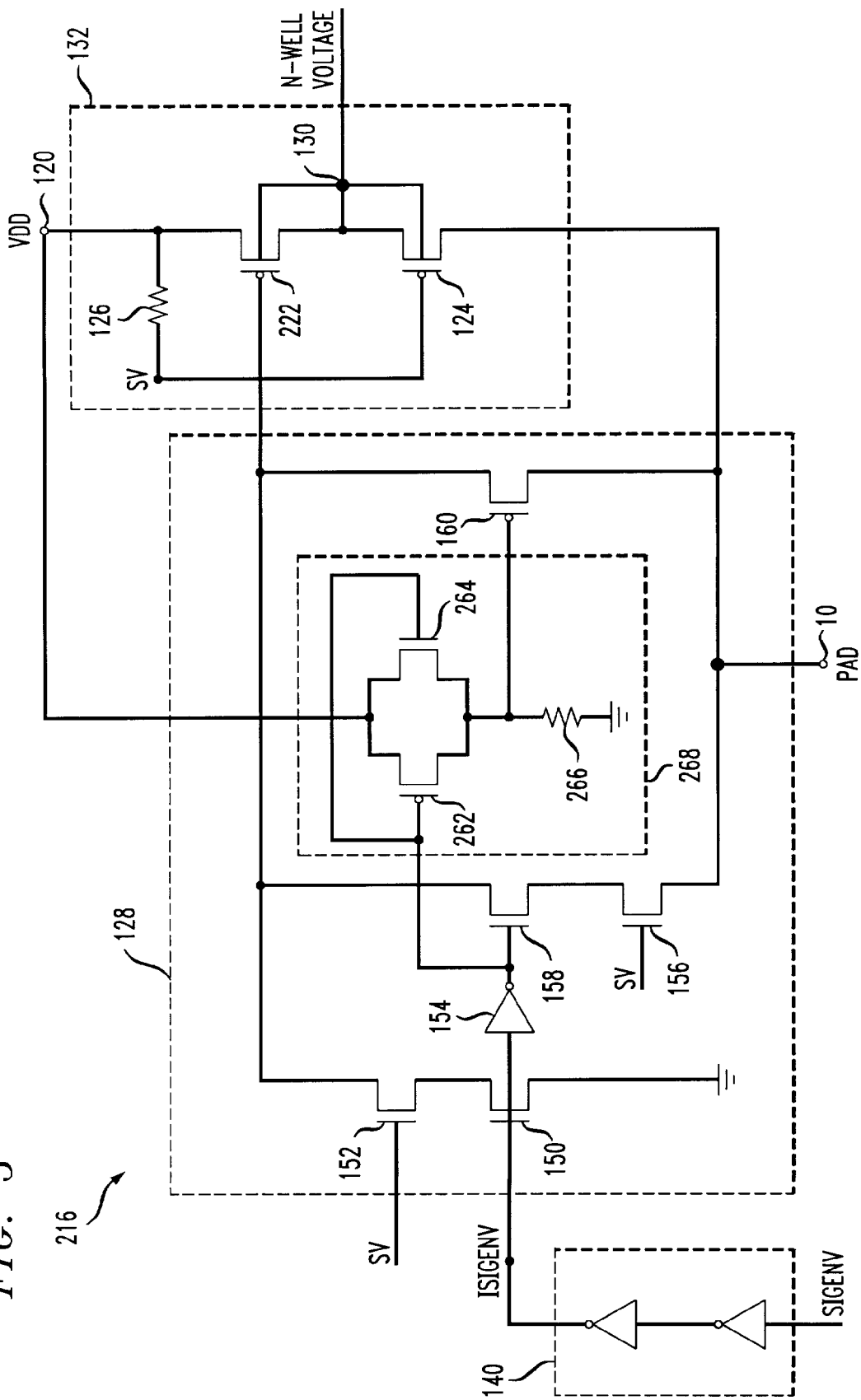
FIG. 5 is a circuit diagram of the substrate voltage control circuit of the buffer of FIG. 3 according to a second embodiment of the present invention.

A second embodiment of the control circuit 216 is illustrated in FIG. 5. The control circuit 216 of FIG. 5 is similar in form and construction to the control circuit 116 of FIG. 4, except that the first output stage transistor 222 has a threshold approximately equal to the thresholds of the other p-type transistors of the control circuit 216 and the additional buffer circuitry 18 rather than the high threshold (relative to the other p-type transistors of the control circuit 216 and the additional buffer circuitry 18) of p-type transistor 122 of FIG. 4. In order to ensure that the transistor 222 is turned off before the transistor 124 is turned on when the pad voltage is rising to 5 volts, a parallel transistor circuit 268 is connected to the gate of the additional p-type transistor 160 to ensure that the voltage at the gate of the additional transistor 160 is lower than voltage at the gate of the second output stage transistor 124 (which is at VDD). The parallel transistor circuit 268 sets the gate voltage of the additional transistor 160 to VDD-VTN when the ISIGENV signal is set to logic 0 (0 volts) corresponding to the 5 volt mode, since the gate of the first bias transistor 264 is controlled by the output of the inverter 154 (whose input is ISIGENV), which will be at logic 1 when in a 5 volt signaling environment. The second bias transistor 262 ensures that the additional transistor 160 is turned off in 3.3 volt mode by setting the gate voltage of transistor 160 to VDD.

Figure 6:
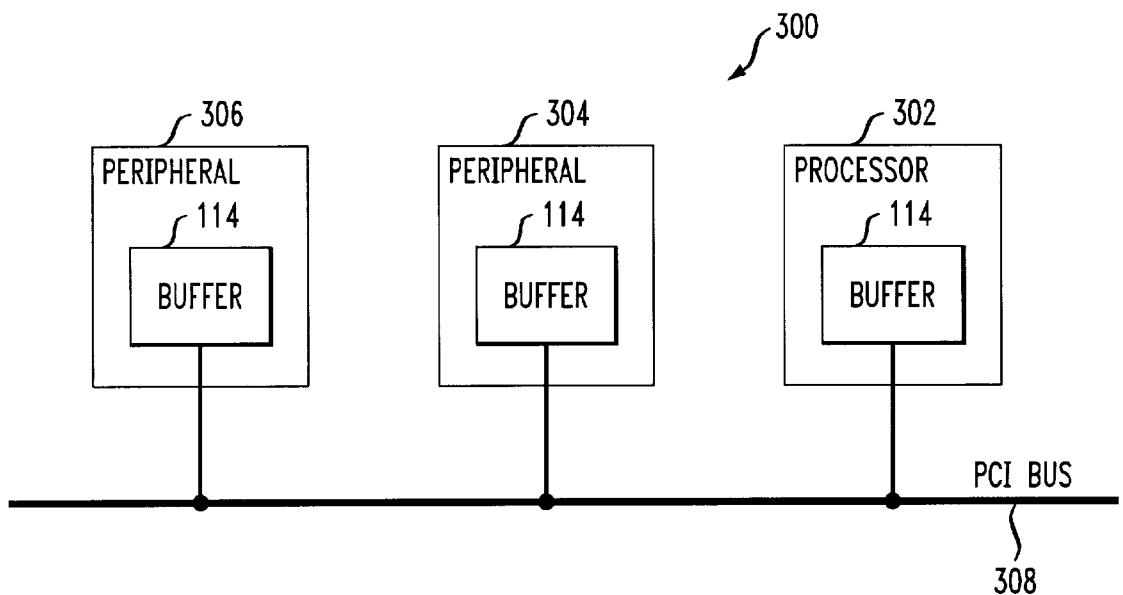
FIG. 6 is a block diagram of a computer system including components that use the buffer of FIG. 3.

FIG. 6 illustrates a computer system 300 with a plurality of electronic circuits that interface with a PCI bus 308, each of which includes the buffer 114 of FIG. 3. The circuits include a processor circuit 302 and two peripheral circuits 304, 306. Each of the circuits is connected to a bus 308 through a buffer 114. It should be noted that it is not necessary that all circuits connected to the bus 308 include the 5 volt tolerant, 3 volt buffer 114 according to the present invention as is shown in FIG. 6. For example, some circuits may be implemented with 5 volt technology and be configured to produce 5 volt signals. The buffer 114 according to the present invention allows for such differences.

The above description and accompanying drawings are only illustrative of preferred embodiments of the invention. It is not intended that the invention be limited to the embodiments shown and described herein as many changes and modifications can be made without departing from the spirit or scope of the invention. Accordingly, the invention is not limited by the foregoing description but is only limited by the spirit and scope of the following claims.

What is claimed as new and desired to be protected by Letters Patent of the United States is:

1. An integrated circuit having an adaptive buffer for interfacing with a signaling path, the adaptive buffer being configured to operate in a first voltage signaling mode on the signaling path, the first voltage signaling mode having a first logical high voltage, and a second voltage signaling mode on the signaling path, the second voltage signaling mode having a second logical high voltage, the first logical high voltage being of a higher potential than the second logical high voltage, the buffer being provided with a supply voltage, the adaptive buffer comprising:

a buffer circuit adapted to communicate with the signaling path; and a control circuit adapted to be connected to the signaling path and the supply voltage, the control circuit being operative in the second voltage signaling mode to clamp a signaling path voltage to the supply voltage upon the occurrence of the signaling path voltage being higher than the second logical high voltage.

2. The integrated circuit of claim 1, wherein the buffer circuit comprises at least one p-type transistor in an N-well substrate, and the control circuit is connected to the substrate and is operative to bias the substrate to the more positive voltage of either the signaling path voltage plus a p-type threshold voltage or the supply voltage under all operating conditions occurring on the signaling path.

3. The integrated circuit of claim 2, wherein the control circuit comprises:

an output stage connected to bias the substrate; and a gate control circuit connected to operate the output stage, the gate control circuit being operative in response to a control signal which represents whether the first or second voltage signaling mode is in use.

4. The integrated circuit of claim 3, further comprising a discriminator coupled to the gate control circuit, the discriminator being operative to provide the control signal.

5. The integrated circuit of claim 4, wherein the control circuit further comprises an isolation circuit connected between the gate control circuit and the discriminator.

6. The integrated circuit of claim 3, further comprising a memory connected to the gate control circuit, the memory being operative to provide the control signal.

7. The integrated circuit of claim 3, wherein the output stage comprises:
   a first output stage transistor connected on one side to a second output stage transistor and on a remaining side to the supply voltage, the gate of the first output stage transistor being connected to an output of the gate control circuit; and
   a second output stage transistor, the second output stage transistor being connected on a remaining side to the signaling path, the gate of the second output stage transistor being connected to the supply voltage, the second output stage transistor being a lower threshold p-type transistor than the first output stage transistor;
   wherein the gate control circuit is operative in response to the control signal to pull down the gate of the first output stage transistor when the signaling path voltage is less than the supply voltage plus the p-type transistor threshold voltage, and to turn off the first output stage transistor when the signaling path voltage exceeds the supply voltage plus the threshold voltage of the first output stage transistor.

8. The integrated circuit of claim 7, wherein the gate control circuit comprises:
   a first pull down circuit connected to the gate of the first output stage transistor and to ground, the first pull down circuit being operative in response to the control signal to pull down the gate of the first output stage transistor when the control signal indicates the second voltage signaling mode; and
   a second pull down circuit connected to the gate of the first output stage transistor and to the signaling path, the second pull down circuit being operative in response to the control signal to pull down the gate of the first output stage transistor when the control signal indicates the first voltage signaling mode is in use and the signaling path voltage is a logical low value.

9. The integrated circuit of claim 8, wherein the gate control circuit further comprises:
   an additional p-type transistor, the gate of the additional transistor being connected to the supply voltage, one side of the additional transistor being connected to the gate of the first output stage transistor, a remaining side of the additional transistor being adapted to be connected to the signaling path, the additional p-type transistor being operative to turn off the first output stage transistor before the second output stage transistor turns on when the signaling path voltage is greater than the supply voltage.

10. The integrated circuit of claim 8, wherein the first pull down circuit comprises:
    a first isolation transistor, one side of the first isolation transistor being connected to the output of the gate control circuit, the gate of the first isolation transistor being adapted to be connected to the supply voltage; and
    a first pull down transistor, the gate of the first pull down transistor being connected to receive the control signal, one side of the first pull down transistor being connected to a remaining side of the first isolation transistor, the remaining side of the first pull down transistor being grounded.

11. The integrated circuit of claim 8, wherein the second pull down circuit comprises:
    a second pull down transistor, the gate of the second pull down transistor being connected to an inverter, one side of the second pull down transistor being connected to the gate of the first output stage transistor;
    an inverter connected to receive the control signal; and
    a second isolation transistor, the gate of the second isolation transistor being connected to the supply voltage, one side of the second isolation transistor being connected to ground, a remaining side of the second isolation transistor being connected to a remaining side of the second pull down transistor.

12. The integrated circuit of claim 3, wherein the output stage comprises:
    a first output stage transistor connected on one side to a second output stage transistor and on a remaining side to the supply voltage, the gate of the first output stage transistor being connected to an output of the gate control circuit; and
    a second output stage transistor, the second output stage transistor being connected on a remaining side to signaling path, the second output stage transistor gate being connected to the supply voltage;
    wherein the gate control circuit is operative in response to the control signal to pull down the gate of the first output stage transistor when the signaling path voltage is less than the supply voltage plus a p-type transistor threshold voltage, and to turn off the first output stage transistor when the signaling path voltage exceeds the supply voltage plus the p-type transistor threshold voltage.

13. The integrated circuit of claim 12, wherein the gate control circuit comprises:
    a first pull down circuit connected to the gate of the first output stage transistor and to ground, the first pull down circuit being operative in response to the control signal to pull down the gate of the first output stage transistor when the control signal indicates the second voltage signaling mode is in use; and
    a second pull down circuit connected to the gate of the first output stage transistor and to the signaling path, the second pull down circuit being operative in response to the control signal to pull down the gate of the first output stage transistor when the control signal indicates the first voltage signaling mode is in use and the signaling path voltage is a logical low value.

14. The integrated circuit of claim 13, wherein the gate control circuit further comprises:
    an additional p-type transistor, the gate of the additional transistor being connected to a parallel transistor circuit, one side of the additional transistor being connected to the gate of the first output stage transistor, a remaining side of the additional transistor being adapted to be connected to the signaling path, the additional p-type transistor being operative to turn off the first output stage transistor before the second output stage transistor turns on when the signaling path voltage is greater than the supply voltage; and wherein
    the parallel transistor circuit comprises an n-type transistor and a p-type transistor connected in parallel, the parallel transistor circuit being connected to the gate of the additional p-type transistor and being adapted to be connected to the supply voltage, the gates of the n-type transistor and p-type transistor being connected to the inverter.

15. The integrated circuit of claim 13, wherein the first pull down circuit comprises:
   a first isolation transistor, one side of the first isolation transistor being connected to the output of the gate control circuit, the gate of the first isolation transistor being adapted to be connected to the supply voltage; and
   a first pull down transistor, the gate of the first pull down transistor being adapted to receive the control signal, one side of the first pull down transistor being connected to a remaining side of the first isolation transistor.

16. The integrated circuit of claim 13, wherein the second pull down circuit comprises:
   an inverter connected to receive the control signal;
   a second pull down transistor, the gate of the second pull down transistor being connected to the inverter, one side of the second pull down transistor being connected to the gate of the first output stage transistor; and
   a second isolation transistor, the gate of the second isolation transistor being adapted to be connected to the supply voltage, one side of the second isolation transistor being adapted to be connected to the signaling path, a remaining side of the second isolation transistor being connected to a remaining side of the second pull down transistor.

17. The integrated circuit of claim 7, wherein the first logical high voltage is approximately 5 volts and the second logical high voltage is approximately 3.3 volts.

18. The integrated circuit of claim 12, wherein the first logical high voltage is approximately 5 volts and the second logical high voltage is approximately 3.3 volts.

19. A computer system comprising:
   a power supply operative to provide a power supply voltage;
   a signaling path;
   at least one processor; and
   at least one circuit connected to the processor by the signaling path;
   at least one of the processor and the circuit including an adaptive buffer connected between the at least one of the processor and the circuit and the signaling path for interfacing with the signaling path, the buffer being configured to operate in a first voltage signaling mode on the signaling path, the first voltage signaling mode having a first logical high voltage, and a second voltage signaling mode on the signaling path, the second voltage signaling mode having a second logical high voltage of lower potential than the first logical high voltage, the adaptive buffer comprising:
      a buffer circuit connected to the signaling path; and
      a control circuit connected to the signaling path and the power supply, the control circuit being operative in the second voltage signaling mode to clamp a signaling path voltage to the supply voltage upon the occurrence of the signaling path voltage being higher that the second logical high voltage.

20. The computer system of claim 19, wherein the buffer circuit comprises at least one p-type transistor in an N-well substrate, and the control circuit is connected to the substrate and is operative to bias the substrate to the more positive voltage of either the signaling path voltage plus a p-type transistor threshold voltage or the power supply voltage under all operating conditions on the signaling path.

21. The computer system of claim 20, wherein the control circuit comprises:
   an output stage connected to bias the substrate; and
   a gate control circuit connected to operate the output stage, the gate control circuit being operative in response to a control signal which represents whether the first or second voltage signaling mode is in use.

22. The computer system of claim 21, further comprising a discriminator coupled to the gate control circuit, the discriminator being operative to provide the control signal.

23. The computer system of claim 22, wherein the control circuit further comprises an isolation circuit connected between the gate control circuit and the discriminator.

24. The computer system of claim 21, further comprising a memory connected to the gate control circuit, the memory being operative to provide the control signal.

25. The computer system of claim 21, wherein the output stage comprises:
   a first output stage transistor connected on one side to a second output stage transistor and on a remaining side to the supply voltage, the gate of the first output stage transistor being connected to an output of the gate control circuit, the first output stage transistor being a high threshold p-type transistor; and
   a second output stage transistor, the second output stage transistor being connected on a remaining side to the signaling path, the second output stage transistor gate being connected to the supply voltage;
   wherein the gate control circuit is operative in response to the control signal to pull down the gate of the first output stage transistor when the signaling path voltage is less than the supply voltage plus the p-type transistor threshold voltage, and to turn off the first output stage transistor when the signaling path voltage exceeds the supply voltage plus the p-type transistor threshold voltage.

26. The computer system of claim 25, wherein the gate control circuit comprises:
   a first pull down circuit connected to the gate of the first output stage transistor and to ground, the first pull down circuit being operative in response to the control signal to pull down the gate of the first output stage transistor when the control signal indicates the second voltage signaling mode is in use; and
   a second pull down circuit connected to the gate of the first output stage transistor and to the signaling path, the second pull down circuit being operative in response to the control signal to pull down the gate of the first output stage transistor when the control signal indicates the first voltage signaling mode is in use and the signaling path voltage is a logical low value.

27. The computer system of claim 26, wherein the gate control circuit further comprises:
   an additional p-type transistor, the gate of the additional transistor being connected to the supply voltage, one side of the of the additional transistor being connected to the gate of the first output stage transistor, a remaining side of the additional transistor being connected to the signaling path, the additional p-type transistor being operative to turn off the first output stage transistor before the second output stage transistor turns on when the signaling path voltage is greater than the supply voltage.

28. The computer system of claim 26, wherein the first pull down circuit comprises:
   a first isolation transistor, one side of the first isolation transistor being connected to the output of the gate control circuit, the gate of the first isolation transistor being connected to the supply voltage; and a first pull down transistor, the gate of the first pull down transistor being connected to receive the control signal, one side of the first pull down transistor being connected to a remaining side of the first isolation transistor, the remaining side of the first pull down transistor being grounded.

29. The computer system of claim 26, wherein the second pull down circuit comprises:

an inverter connected to receive the control signal;

a second pull down transistor, the gate of the second pull down transistor being connected to the inverter, one side of the second pull down transistor being connected to the gate of the first output stage transistor;

and a second isolation transistor, the gate of the second isolation transistor being connected to the supply voltage, one side of the second isolation transistor being connected to ground, a remaining side of the second isolation transistor being connected to a remaining side of the second pull down transistor.

30. The computer system of claim 21, wherein the output stage comprises:

a first output stage transistor connected on one side to a second output stage transistor and on a remaining side to the supply voltage, the gate of the first output stage transistor being connected to an output of the gate control circuit; and a second output stage transistor, the second output stage transistor being connected on a remaining side to the signaling path, the second output stage transistor gate being connected to the supply voltage;

wherein the gate control circuit is operative in response to said control signal to pull down the gate of the first output stage transistor when the signaling path voltage is less than the supply voltage plus a p-type transistor threshold voltage, and to turn off the first output stage transistor when the signaling path voltage exceeds the supply voltage plus the p-type transistor threshold voltage.

31. The computer system of claim 30, wherein the gate control circuit comprises:

a first pull down circuit connected to the gate of the first output stage transistor and to ground, the first pull down circuit being operative in response to the control signal to pull down the gate of the first output stage transistor when the control signal indicates the second voltage signaling mode is in use; and a second pull down circuit connected to the gate of the first output stage transistor and to the signaling path, the second pull down circuit being operative in response to the control signal to pull down the gate of the first output stage transistor when the control signal indicates the first voltage signaling mode is in use and the signaling path voltage is a logical low value.

32. The computer system of claim 31, wherein the gate control circuit further comprises:

an additional p-type transistor, the gate of the additional transistor being connected to a parallel transistor circuit, one side of the of the additional transistor being connected to the gate of the first output stage transistor, a remaining side of the additional transistor being grounded; and wherein the parallel transistor circuit comprises an n-type transistor and a p-type transistor connected in parallel, the parallel transistor circuit being connected between the gate of the additional p-type transistor and the supply voltage, the gates of the n-type transistor and p-type transistor being connected to the inverter.

33. The computer system of claim 31, wherein the first pull down circuit comprises:

a first isolation transistor, one side of the first isolation transistor being connected to the output of the gate control circuit, the gate of the first isolation transistor being connected to the supply voltage; and a first pull down transistor, the gate of the first pull down transistor being adapted to receive the control signal, one side of the first pull down transistor being connected to a remaining side of the first isolation transistor.

34. The computer system of claim 31, wherein the second pull down circuit comprises:

an inverter connected to receive the control signal;

a second pull down transistor, the gate of the second pull down transistor being connected to the inverter, one side of the second pull down transistor being connected to the gate of the first output stage transistor; and a second isolation transistor, the gate of the second isolation transistor being connected to the supply voltage, one side of the second isolation transistor being connected to the signaling path, a remaining side of the second isolation transistor being connected to a remaining side of the second pull down transistor.

35. The computer system of claim 25, wherein the first logical high voltage is approximately 5 volts and the second logical high voltage is approximately 3.3 volts.

36. The computer system of claim 30, wherein the first logical high voltage is approximately 5 volts and the second logical high voltage is approximately 3.3 volts.

37. A method for operating an integrated circuit having a buffering device with a signaling path such that die buffering device is configured to operate in both a first voltage signaling mode on the signaling path, the first voltage signaling mode having a first logical high voltage, and a second voltage signaling mode on the signaling path, the second voltage signaling mode having a second logical high voltage of lower potential than the first logical high voltage, the method comprising:

connecting the buffering device to the signaling path and a power supply; and clamping the signaling path voltage to the supply voltage in the second signaling mode upon the occurrence of a signaling path voltage higher than the second logical high voltage.

38. The method of claim 37, further comprising the step of biasing the N-well substrate of all p-type transistors included in the buffering device to the more positive voltage of either the signaling path voltage plus a p-type threshold voltage or the supply voltage under all operating conditions occurring on the signaling path.

39. The method of claim 38, wherein the biasing step comprises biasing the substrate in response to an applied control signal which represents whether the first or second signaling mode is present on the signaling path.

40. The method of claim 39, wherein the control signal is provided by a discriminator which detects a voltage representing whether said first or second voltage signaling mode is present.

41. The method of claim 39, wherein the control signal is provided by a memory.

42. An integrated circuit having an adaptive buffer for interfacing with a signaling path, the adaptive buffer being configured to operate in a first voltage signaling mode on the signaling path, the first voltage signaling mode having a first logical high voltage, and a second voltage signaling mode on the signaling path, the second voltage signaling mode having a second logical high voltage, the first logical high voltage being of a higher potential than the second logical high voltage, the buffer being provided with a supply voltage, the adaptive buffer comprising:

a buffer circuit comprising at least one p-type transistor in a substrate, the buffer circuit being adapted to communicate with the signaling path; and a control circuit connected to the substrate and adapted to be connected to the signaling path and the supply voltage, the control circuit being operative to bias the substrate to the more positive voltage of either a signaling path voltage plus a p-type threshold voltage or the supply voltage under all operating conditions occurring on the signaling path.

43. The integrated circuit of claim 42, wherein the control circuit comprises:

an output stage connected to bias the substrate; and a gate control circuit connected to operate the output stage, the gate control circuit being operative in response to a control signal which represents whether the first or second voltage signaling mode is in use.

44. The integrated circuit of claim 43, further comprising a discriminator coupled to the gate control circuit, the discriminator being operative to provide the control signal.

45. The integrated circuit of claim 43, further comprising a memory connected to the gate control circuit, the memory being operative to provide the control signal.

46. The integrated circuit of claim 43, wherein the output stage comprises:

a first output stage transistor connected on one side to a second output stage transistor and on a remaining side to the supply voltage, the gate of the first output stage transistor being connected to an output of the gate control circuit; and a second output stage transistor, the second output stage transistor being connected on a remaining side to the signaling path, the gate of the second output stage transistor being connected to the supply voltage, the second output stage transistor being a lower threshold p-type transistor than the first output stage transistor;

wherein the gate control circuit is operative in response to the control signal to pull down the gate of the first output stage transistor when the signaling path voltage is less than the supply voltage plus the p-type transistor threshold voltage, and to turn off the first output stage transistor when the signaling path voltage exceeds the supply voltage plus the threshold voltage of the first output stage transistor.

47. The integrated circuit of claim 43, wherein the output stage comprises:

a first output stage transistor connected on one side to a second output stage transistor and on a remaining side to the supply voltage, the gate of the first output stage transistor being connected to an output of the gate control circuit; and a second output stage transistor, the second output stage transistor being connected on a remaining side to signaling path, the second output stage transistor gate being connected to the supply voltage;

wherein the gate control circuit is operative in response to the control signal to pull down the gate of the first output stage transistor when the signaling path voltage is less than the supply voltage plus a p-type transistor threshold voltage, and to turn off the first output stage transistor when the signaling path voltage exceeds the supply voltage plus the p-type transistor threshold voltage.

48. A computer system comprising:

a power supply operative to provide a power supply voltage;

a signaling path;

at least one processor; and at least one circuit connected to the processor by the signaling path;

at least one of the processor and the circuit including an adaptive buffer connected between the at least one of the processor and the circuit and the signaling path for interfacing with the signaling path, the buffer being configured to operate in a first voltage signaling mode on the signaling path, the first voltage signaling mode having a first logical high voltage, and a second voltage signaling mode on the signaling path, the second voltage signaling mode having a second logical high voltage of lower potential than the first logical high voltage, the adaptive buffer comprising:

a buffer circuit comprising at least one p-type transistor in a substrate, the buffer circuit being connected to the signaling path; and a control circuit connected to the substrate, the signaling path and the power supply, the control circuit being operative to bias the substrate to the more positive voltage of either a signaling path voltage plus a p-type transistor threshold voltage or the power supply voltage under all operating conditions on the signaling path.

49. The computer system of claim 48, wherein the control circuit comprises:

an output stage connected to bias the substrate; and a gate control circuit connected to operate the output stage, the gate control circuit being operative in response to a control signal which represents whether the first or second voltage signaling mode is in use.

50. The computer system of claim 49, further comprising a discriminator coupled to the gate control circuit, the discriminator being operative to provide the control signal.

51. The computer system of claim 49, further comprising a memory connected to the gate control circuit, the memory being operative to provide the control signal.

52. The computer system of claim 49, wherein the output stage comprises:

a first output stage transistor connected on one side to a second output stage transistor and on a remaining side to the supply voltage, the gate of the first output stage transistor being connected to an output of the gate control circuit, the first output stage transistor being a high threshold p-type transistor; and a second output st age transistor, the second output stage transistor being connected on a remaining side to the signaling path, the second output stage transistor gate being connected to the supply voltage;

wherein the gate control circuit is operative in response to the control signal to pull down the gate of the first output stage transistor when the signaling path voltage is less than the supply voltage plus the p-type transistor threshold voltage, and to turn off the first output stage transistor when the signaling path voltage exceeds the supply voltage plus the p-type transistor threshold voltage.

53. The computer system of claim 49, wherein the gate control circuit comprises:

a first pull down circuit connected to the gate of the first output stage transistor and to ground, the first pull down circuit being operative in response to the control signal to pull down the gate of the first output stage transistor when the control signal indicates the second voltage signaling mode is in use; and a second pull down circuit connected to the gate of the first output stage transistor and to the signaling path, the second pull down circuit being operative in response to the control signal to pull down the gate of the first output stage transistor when the control signal indicates the first voltage signaling mode is in use and the signaling path voltage is a logical low value.

* * * * *